United States Patent

Uchiyama et al.

[11] Patent Number: 5,773,890
[45] Date of Patent: Jun. 30, 1998

[54] SEMICONDUCTOR DEVICE THAT PREVENTS PEELING OF A TITANIUM NITRIDE FILM

[75] Inventors: Tomoyuki Uchiyama; Yasuo Kasagi, both of Tokyo, Japan

[73] Assignee: Nippon Steel Corporation, Tokyo, Japan

[21] Appl. No.: 703,533

[22] Filed: Aug. 27, 1996

[30] Foreign Application Priority Data

Dec. 28, 1995 [JP] Japan ................................ 7-353488

[51] Int. Cl.$^6$ .......................... H01L 23/48; H01L 23/52; H01L 29/40
[52] U.S. Cl. ..................... 257/753; 257/751; 257/763; 257/764; 257/767; 257/770; 257/774
[58] Field of Search .................................. 257/751, 763, 257/764, 767, 915

[56] References Cited

U.S. PATENT DOCUMENTS 5,567,987  10/1996  Lee .......................................... 257/915
5,572,071  11/1996  Lee .......................................... 257/915

FOREIGN PATENT DOCUMENTS

A-4-3923     1/1992  Japan .
A-4-142062   5/1992  Japan .
6-97112      4/1994  Japan ..................................... 257/915

Primary Examiner—Teresa M. Arroyo
Attorney, Agent, or Firm—Pollock, Vande Sande & Priddy

[57] ABSTRACT

A titanium film 14 is formed on a whole surface including an inner surface of a hole 10. Then the titanium film 14 outside of the interior of the hole 10 is removed by the chemical mechanical polishing (CMP) method, the resist etchback method or the ECR plasma etching method. Thereafter a titanium nitride film 15 is formed on the whole surface. Consequently, when a tungsten film 16 is formed, using a fluorine containing gas such as $WF_6$ gas, etc., since there exists no titanium film 14 outside of the hole 10 and only the titanium nitride film 15 resistant to the fluorine containing gas exists there, no peeling-off of the titanium nitride film 15 due to corrosion of the titanium film 14 takes place, and thus it is prevented that it produces a dust source.

31 Claims, 7 Drawing Sheets

FIG.4A
FIG.4B
FIG.4C
FIG.4D
FIG.4E
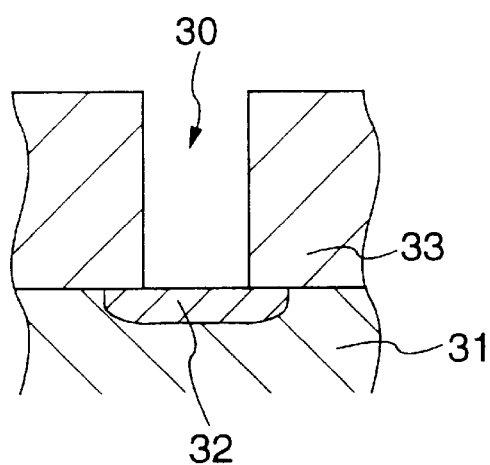
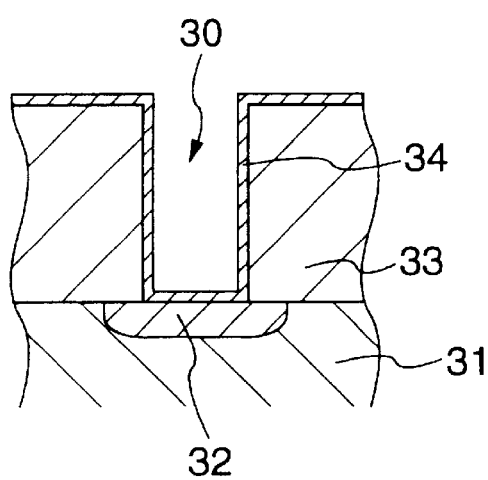
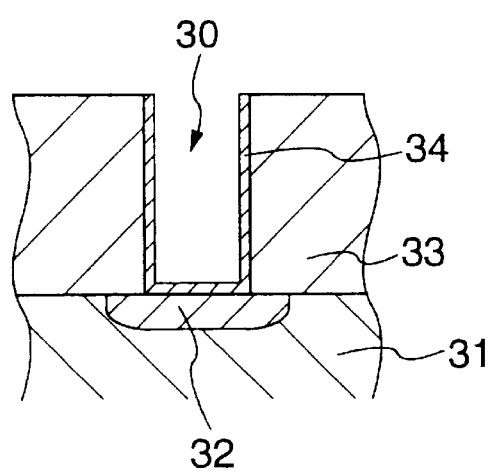
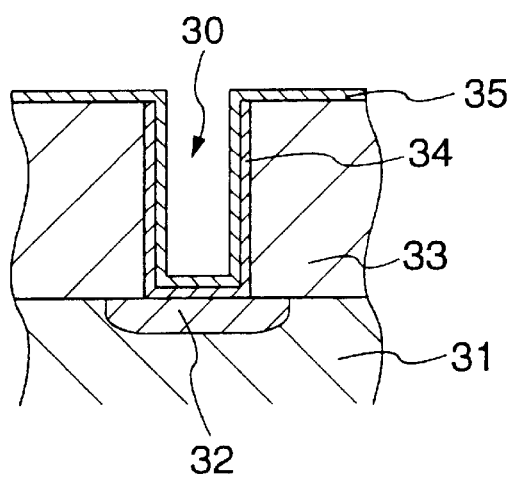
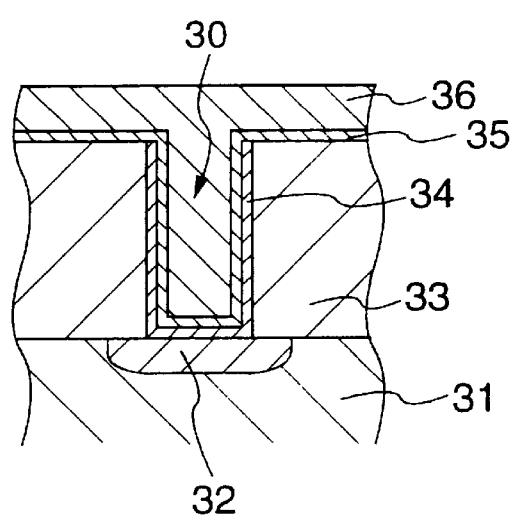

SEMICONDUCTOR DEVICE THAT PREVENTS PEELING OF A TITANIUM NITRIDE FILM

BACKGROUND OF THE INVENTION

1. Field of the Invention

The present invention relates to a semiconductor device and a method for fabricating the same, and in particular to a semiconductor device and a method for fabricating the same suitable for a case where a contact structure is formed for wiring on an interlayer insulating film disposed on a semiconductor substrate.

2. Description of the Related Art

As integration density increases and patterns become finer for a semiconductor device and in particular an LSI, an aspect ratio of a hole for a wiring connection, such as a contact hole, a via-contact, etc., formed in an insulating film becomes greater. Here the aspect ratio is defined as a ratio of height to diameter of a relevant hole. Further, since the distance between adjacent holes decreases in order to increase the integration density and residue is formed during an etching step for wiring, application of wet etching techniques thereto become more and more difficult. Nevertheless increase in the aspect ratio advances acceleratedly with decrease in design rule.

The problem of burying a wiring film in a hole, such as a contact hole, becomes more serious with the increasing aspect ratio. For dealing with this problem, heretofore CVD (chemical vapor deposition) techniques using tungsten, etc. were applied thereto. Since the CVD method is a method for forming a film, using a superficial reaction, a film can be formed on a side wall and a bottom of a contact hole having a great aspect ratio.

However, an electrically conductive underlayer is usually needed for a film formation using tungsten by the CVD method. In addition, since a tungsten containing gas such as $WF_6$ is usually used as a raw material gas by the CVD method using tungsten, an electrically conductive underlayer resistant to the tungsten containing gas, e.g. a titanium nitride film, is used as the underlayer. On the other hand, if a titanium nitride film is formed directly on a diffusion layer in a substrate, the diffusion layer is nitrated and contact resistance increases. Therefore, a method by which a thin titanium, titanium alloy, or titanium silicide film is disposed between the diffusion layer and the titanium nitride film is used. This titanium film is formed usually by the sputtering method.

An example of the method for forming the conventional contact structure is disclosed in JP-A-4-142062. Hereinbelow this method will be explained.

First, a titanium film is formed on an interlayer insulating film disposed on a silicon substrate.

Subsequently a hole reaching the silicon substrate is formed in this titanium film and the interlayer insulating film.

Next a titanium (Ti)/titanium nitride (TiN) film is formed by the sputtering method on the whole surface including the inner surface of the hole.

Thereafter a tungsten (W) film is formed by the CVD method using $WF_6$, $SiH_4$, etc. as raw material gases.

However, according to the prior art method, the film thickness of the titanium/titanium nitride film thus formed was thin on the inner surface of the hole and corrosion of the titanium film by the fluorine containing gas such as $WF_6$, etc. was produced, starting from this portion. When this corrosion of the titanium film was produced, the titanium/titanium nitride film formed on the titanium film on the upper surface of the interlayer insulating film was easily peeled off, which gave rise to a problem that peeled titanium/titanium nitride films constitute a dust source and result in lower production yield.

As indicated in FIG. 1, holes 110 are formed in the neighborhood of an element region A of a silicon wafer 100 serving as the silicon substrate and peeling-off of the titanium/titanium nitride film is produced very easily at this portion. Particularly, titanium/titanium nitride films peeled off at this portion often constitute a dust source contaminating the element region A.

On the other hand, JP-A-4-3923 discloses a method for fabricating a semiconductor device comprising the steps of forming an insulating film and an aluminium or aluminium alloy film on a substrate; forming a contact hole passing through the insulating film and the aluminium or aluminium alloy film; depositing a tungsten film on the whole surface of the substrate; and removing thereafter the tungsten film except for the interior of the contact hole by a dry etching method using a fluoric compound or a chloric compound and subsequently removing the aluminium or aluminium alloy film. An object of this method is to prevent overetching of the tungsten film where tungsten should be left only in the interior of the contact hole. Here a mode of depositing the tungsten film after having deposited barrier metal on the whole surface of the substrate is described in the step of depositing the tungsten film on the whole surface of the substrate. As examples of the barrier metal, it is described to deposit both titanium and titanium nitride by the sputtering method. However, this is identical to the example of the prior art method for forming a contact structure at a point where tungsten is deposited on these films and also to the upper surface of the substrate by the CVD method and therefore the problem is not solved.

SUMMARY OF THE INVENTION

The present invention has been made for solving the problem of the prior art method for forming the contact structure and the object thereof is to provide a semiconductor device having a contact structure, in which no peeling-off of the electrically conductive film, such as the titanium nitride film resistant to fluorine containing gas due to corrosion of the titanium film or the titanium alloy film, by the fluorine containing gas takes place, and a method for fabricating the same.

In order to achieve the above object, the method for fabricating a semiconductor device according to the present invention comprises the steps of forming a hole in an insulating film on an semiconductor substrate; forming a first electrically conductive film containing either a titanium film or a titanium alloy film at least on the insulating film and on the inner surface of the hole; removing the first electrically conductive film formed outside of the hole; forming a second electrically conductive film resistant to fluorine containing gas at least on the insulating film and the first electrically conductive film; and forming a tungsten film by a CVD method using fluorine containing gas so that at least the hole is filled therewith.

A semiconductor device according to the present invention comprises a semiconductor substrate; an insulating film formed on the semiconductor substrate and having a hole at a desired position; a first electrically conductive film containing either a titanium film or a titanium alloy film, the first electrically conductive film being formed on the inner surface of the hole; and a second electrically conductive film resistant to fluorine containing gas formed at least on the insulating film and the first electrically conductive film.

BRIEF DESCRIPTION OF THE DRAWINGS

FIGS. 4A to 4E are cross-sectional views illustrating a method for fabricating a semiconductor device according to a third embodiment of the present invention in the order of fabrication steps.

DESCRIPTION OF THE PREFERRED EMBODIMENTS

Figure 1:
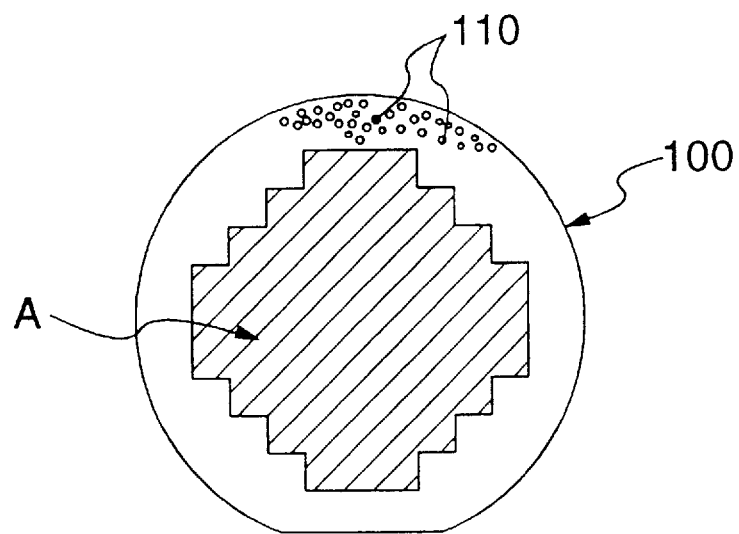
FIG. 1 is a schematical plan view illustrating an element region and a peripheral portion thereof on a semiconductor wafer.

Hereinbelow several embodiments of the present invention will be explained in detail, referring to the drawings.

FIGS. 2A to 2G are cross-sectional views illustrating a method for fabricating a semiconductor device according to a first embodiment of the present invention in the order of fabrication steps.

Figure 2A:
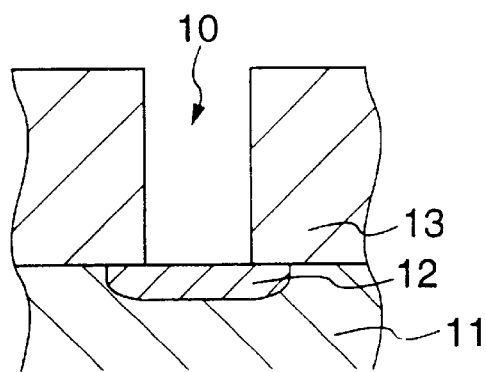
FIGS. 2A to 2G are cross-sectional views illustrating a method for fabricating a semiconductor device according to a first embodiment of the present invention in the order of fabrication steps.

At first, as indicated in FIG. 2A, a hole 10 reaching a diffusion layer 12 is formed by the dry etching method in an interlayer insulating film 13 such as a silicon oxide film, etc. formed on a silicon substrate 11.

Figure 2B:
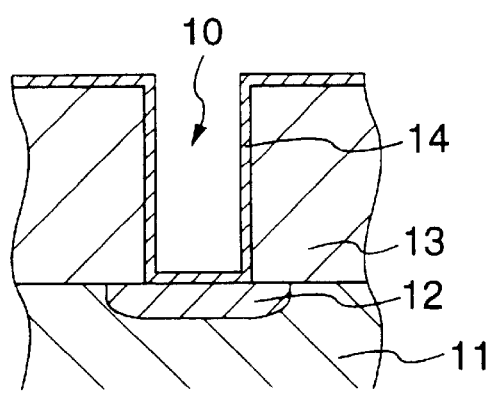

Subsequently, as indicated in FIG. 2B, a titanium film 14 for example 20 nm thick is formed by the sputtering method on the whole surface including the inner surface of the hole 10.

Figure 2C:
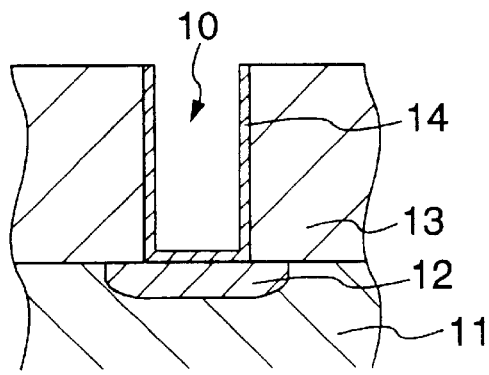

Thereafter, as indicated in FIG. 2C, the titanium film 14 outside of the interior of the hole 10 is removed by the CMP (Chemical Mechanical Polishing) method, by which grinding work is effected chemically and mechanically, using an abrasive, in which solid particles are mixed in a reactive liquid. Further remaining abrasive stuck thereto is removed by a postprocessing.

Figure 2D:
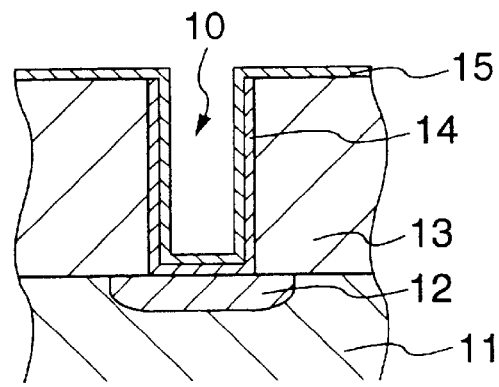

Next, as indicated in FIG. 2D, a titanium nitride film 15 for example, 100 nm thick is formed by the sputtering method on the whole surface. At this time the formation of the titanium nitride film 15 may be effected either by a reactive sputtering method using a titanium target or by a sputtering method using a titanium nitride target.

Figure 2E:
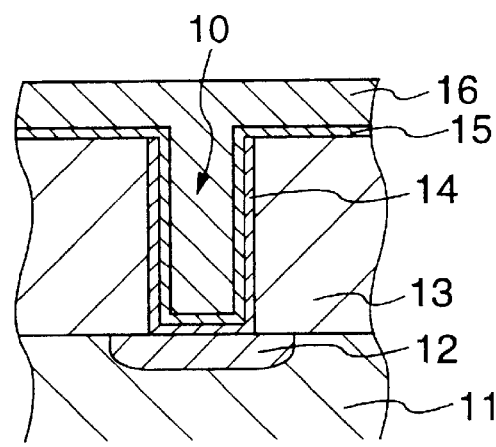

Thereafter, as indicated in FIG. 2E, a tungsten film 16 example, 300 nm thick is formed by the CVD method so that the interior of the hole 10 is filled therewith.

According to this first embodiment, when the tungsten film 16 is formed by using a fluorine containing gas, such as $WF_6$ gas, etc., since no titanium film 14 exists outside of the interior of the hole 10 and there exists only the titanium nitride film 15 resistant to the fluorine containing gas, no peeling-off of the titanium nitride film 15 due to corrosion of the titanium film 14 takes place. In addition, almost no peeling-off of the titanium nitride film 15 due to corrosion of the titanium film 14 takes place in the interior of the hole 10. Further, this is true also at the peripheral portion of the silicon wafer as indicated in FIG. 1. Consequently the contamination problem due to peeling-off of the titanium nitride film 15 does not take place and it is possible to increase fabrication yield.

Figure 2F:
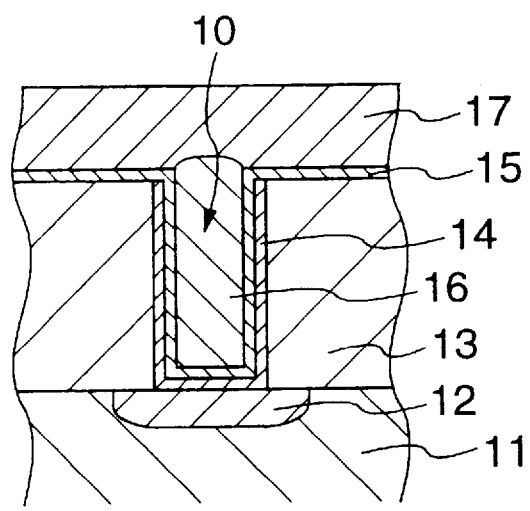

Thereafter, as indicated in FIG. 2F, the tungsten film 16 outside of the interior of the hole 10 is removed by etching, etc. to leave the tungsten film 16 only in the interior of the hole 10. Further a wiring layer 17 made of aluminium (Al), copper (Cu), etc. is formed on the titanium nitride film 15 and the tungsten film 16 and the titanium nitride film 15 and the wiring layer 17 are processed into a desired pattern by using fine processing techniques. It is for the purpose of preventing breaking of the wiring layer 17 that the wiring layer 17 is not formed directly on the insulating film 13 but through the titanium nitride film 15.

Figure 2G:
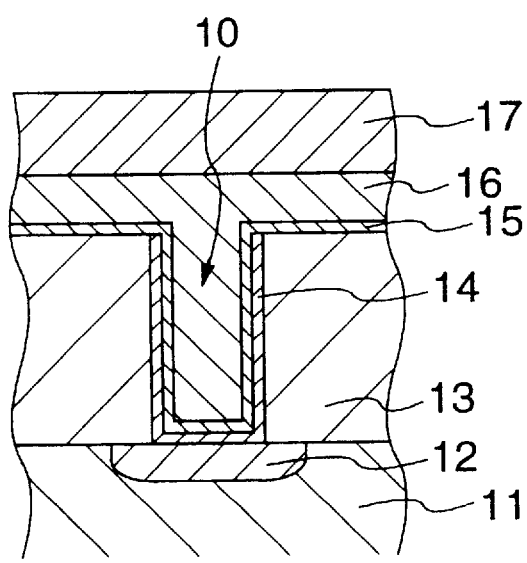

The step of removing the tungsten film 16 outside of the interior of the hole 10 may be omitted and the wiring layer 17 may be formed on the tungsten film 16, as indicated in FIG. 2G. In this case, the overall thickness of the wiring layer is greater than that indicated in FIG. 2F and the formation of a fine pattern is more difficult. However, an advantage is obtained in that it is possible to lower the resistance of pattern wiring.

Now a method for fabricating a semiconductor device according to a second embodiment of the present invention will be explained, referring to FIGS. 3A to 3H.

Figure 3A:
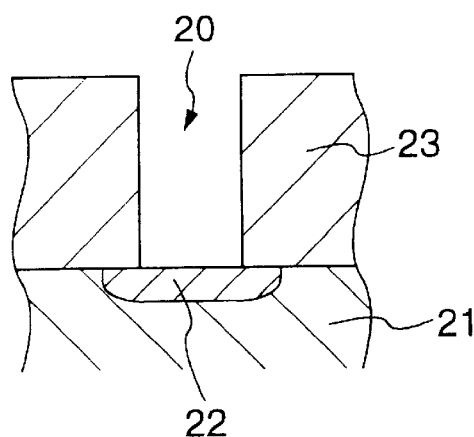
FIGS. 3A to 3H are cross-sectional views illustrating a method for fabricating a semiconductor device according to a second embodiment of the present invention in the order of fabrication steps.

First, as indicated in FIG. 3A, a hole 20 reaching a diffusion layer 22 is formed by the dry etching method in an interlayer insulating film 23 such as a silicon oxide film formed on a silicon substrate 21.

Figure 3B:
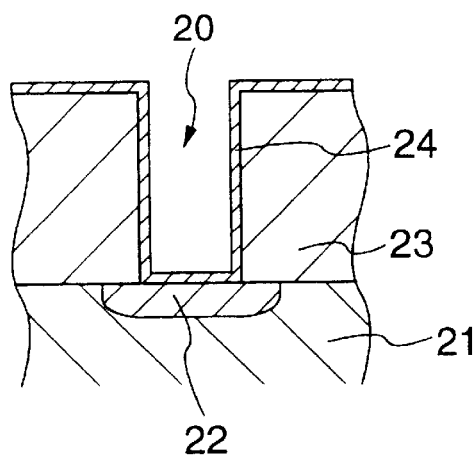

Subsequently, as indicated in FIG. 3B, a titanium film 24 for example, 20 nm thick is formed by the sputtering method on the whole surface thereof including the inner surface of the hole 20.

Figure 3C:
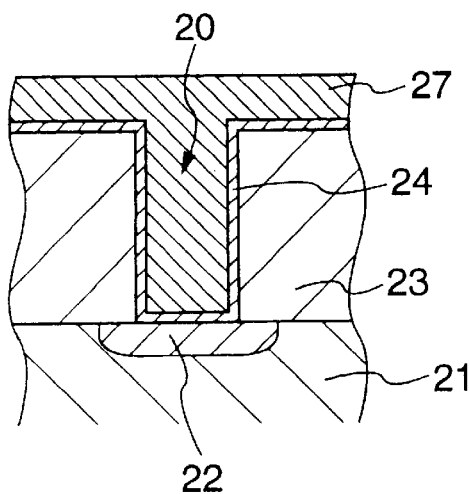

Thereafter, photosensitive resist 27 is applied to the whole surface, as indicated in FIG. 3C. At this time, the hole 20 is filled with the photosensitive resist 27 owing to fluidity thereof, as indicated in the figure.

Figure 3D:
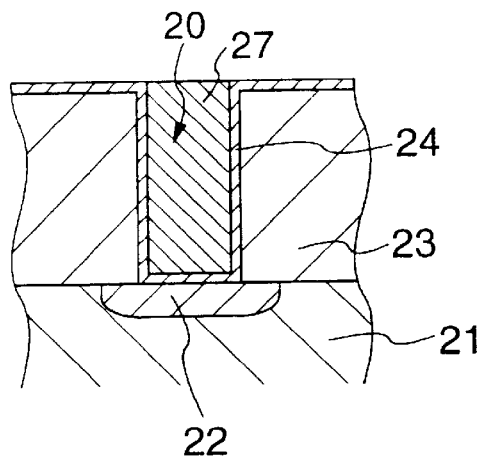

Then, as indicated in FIG. 3D, ashing is effected in oxygen plasma and the photosensitive resist 27 outside of the interior of the hole 20 is removed by the resist etchback method.

Figure 3E:
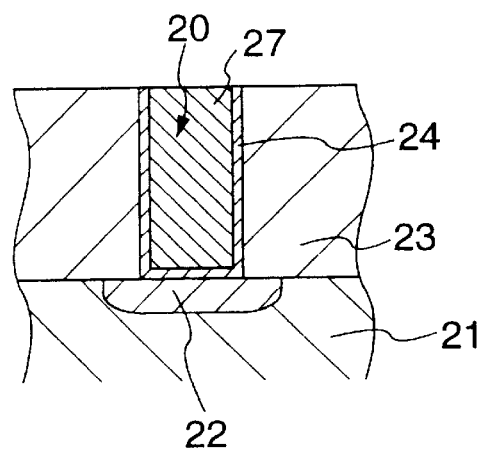

Next, as indicated in FIG. 3E, the titanium film 24 is removed by the dry etching method using a chlorine containing gas. At this time, there exists the photosensitive resist 27 in the interior of the hole 20, this photosensitive resist 27 acts as an etching mask and thus the titanium film 24 in the interior of the hole 20 is not removed.

Figure 3F:
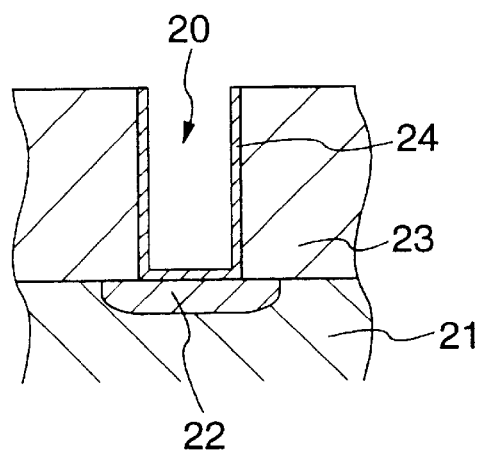

Thereafter, as indicated in FIG. 3F, ashing is effected again to remove the photosensitive resist 27 in the interior of the hole 20.

Figure 3G:
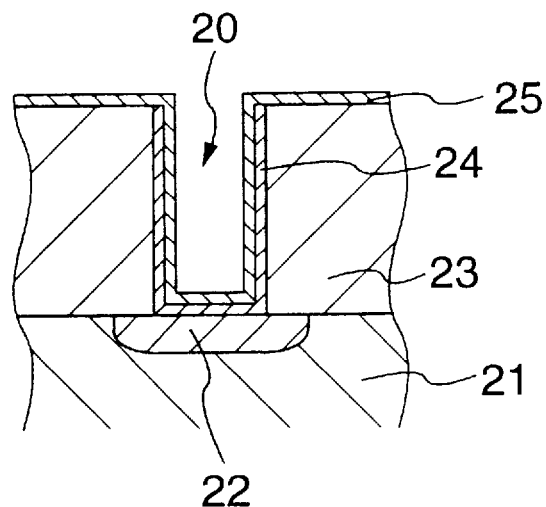

Subsequently, as indicated in FIG. 3G, a titanium nitride film 25 for example, 100 nm thick is formed by the sputtering method on the whole surface. At this time, the formation of the titanium nitride film 25 may be effected either by a reactive sputtering method using a titanium target or by a sputtering method using a titanium nitride target.

Figure 3H:
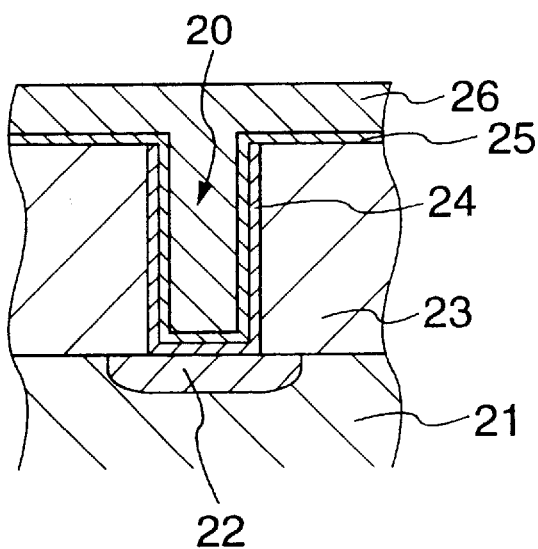

Thereafter, as indicated in FIG. 3H, a tungsten film 26 for example, 300 nm thick is formed by the CVD method so as to fill the hole 20.

Also in this second embodiment, when the tungsten film 26 is formed by using a fluorine containing gas, such as $WF_6$ gas, etc., since no titanium film 24 exists outside of the interior of the hole 20 and there exists only the titanium nitride film 25 resistant to the fluorine containing gas, no peeling-off of the titanium nitride film 25 due to corrosion of the titanium film 24 takes place. In addition, almost no peeling-off of the titanium nitride film 25 due to corrosion of the titanium film 24 takes place in the interior of the hole 20. Further this is true also at the peripheral portion of the silicon wafer as indicated in FIG. 1. Consequently the contamination problem due to peeling-off of the titanium nitride film 25 does not take place and it is possible to increase fabrication yield.

Further, in this second embodiment, in the resist etchback step indicated in FIG. 3D, it is not necessary to leave the photosensitive resist 27 so that the whole inner surface of the hole 20 is covered therewith. That is, it is sufficient if the titanium film 24 remains finally on the bottom surface of the hole 20 and it is not necessary that the titanium film 24 remain on the whole side surface of the hole 20. Consequently, in the resist etchback step indicated in FIG. 3D, it is sufficient that the hole 20 is filled partially with the photosensitive resist 27 and the titanium film 24 can be exposed on the upper portion of the side wall of the hole 20. Therefore it is preferable to effect ashing of the photosensitive resist 27 slightly excessively so that the photosensitive resist 27 outside of the hole 20 is completely removed.

Since the formation of the wiring layer is identical to that described in the first embodiment, explanation thereof is omitted here.

Now a method for fabricating a semiconductor device according to a third embodiment of the present invention will be explained, referring to FIGS. 4A to 4E.

First, as indicated in FIG. 4A, a hole 30 reaching a diffusion layer 32 is formed by the dry etching method in an interlayer insulating film 33, such as a silicon oxide film, formed on a silicon substrate 31.

Subsequently, as indicated in FIG. 4B, a titanium film 34 for example, 20 nm thick is formed by the sputtering method on the whole surface including the inner surface of the hole 30.

Thereafter, as indicated in FIG. 4C, the titanium film 34 outside of the interior of the hole 30 is removed by the ECR (Electron Cyclotron Resonance) plasma etching. At this time, the ECR plasma stream is controlled to be parallel to the surface of the silicon substrate 31 so that no ion can reach the deep portion of the hole 30, and thus the titanium film 34 is not removed at this portion. Therefore the titanium film 34 is not removed at least on the bottom surface and at the lower portion of the side surface of the hole 30 but remains there.

Next, as indicated in FIG. 4D, a titanium nitride film 35 for example, 100 nm thick is formed by the sputtering method on the whole surface. At this time, the formation of the titanium nitride film 35 may be effected either by a reactive sputtering method using a titanium target or by a sputtering method using a titanium nitride target.

Thereafter, as indicated in FIG. 4E, a tungsten film 36 for example, 300 nm thick is formed by the CVD method so as to fill the hole 30 therewith.

Also in this third embodiment, when the tungsten film 36 is formed by using a fluorine containing gas, such as $WF_6$ gas, since no titanium film 34 exists outside of the interior of the hole 30 and there exists only the titanium nitride film 35 resistant to the fluorine containing gas, no peeling-off of the titanium nitride film 35 due to corrosion of the titanium film 34 takes place. In addition, almost no peeling-off of the titanium nitride film 35 due to corrosion of the titanium film 34 takes place in the interior of the hole 30. Further, this is true also at the peripheral portion of the silicon wafer as indicated in FIG. 1. Consequently the contamination problem due to peeling-off of the titanium nitride film 35 does not take place and it is possible to increase fabrication yield.

Since the formation of the wiring layer is identical to that described in the first embodiment, explanation thereof is omitted here.

Now a method for fabricating a semiconductor device according to a fourth embodiment of the present invention will be explained, referring to FIGS. 5A to 5D. This fourth embodiment is identical to the first embodiment except for a point where a lamination film consisting of two titanium nitride films is formed.

Figure 5A:
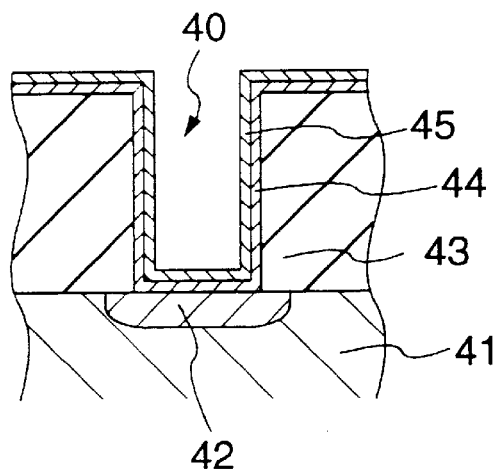
FIGS. 5A to 5D are cross-sectional views illustrating a method for fabricating a semiconductor device according to a fourth embodiment of the present invention in the order of fabrication steps.

First, as indicated in FIG. 5A, a titanium film 44 and a first titanium nitride film 45, which are 20 nm and 50 nm thick, respectively, are formed by the sputtering method on the whole surface including the inner surface of the hole 40 formed in an interlayer insulating film 43 disposed on a silicon substrate 41.

Figure 5B:
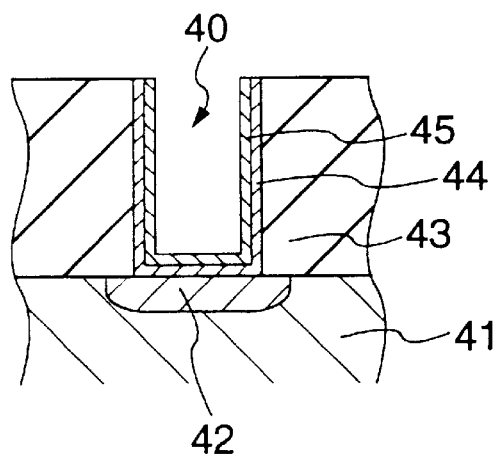

Subsequently, as indicated in FIG. 5B, the titanium film 44 and the titanium nitride film 45 outside of the hole 40 is removed by the CMP method.

Figure 5C:
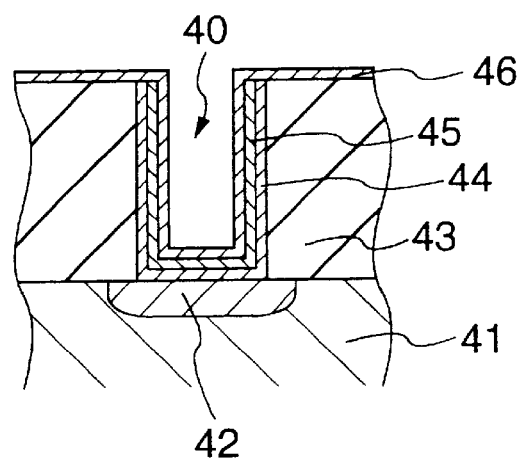

Thereafter, as indicated in FIG. 5C, a second titanium nitride film 46 for example, 100 nm thick is formed by the sputtering method on the whole surface.

Figure 5D:
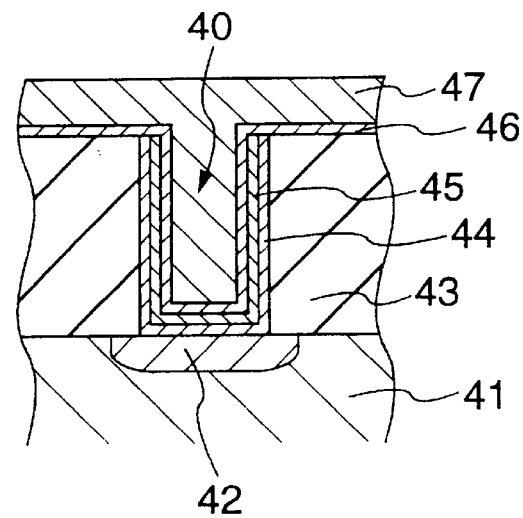

Thereafter, as indicated in FIG. 5D, a tungsten film 47 for example, 300 nm thick is formed by the CVD method on the whole surface so as to fill the interior of the hole 40 therewith.

According to this fourth embodiment, since the titanium film 44, which is relatively easily oxidized, is covered by the first titanium nitride film 45, which is relatively hard to oxidize, it is possible to prevent oxidation of the titanium film when the titanium film outside of the hole 40 is removed by the CMP method.

Although several modes of execution, in which the present invention is applied to formation of a so-called contact hole for connecting wiring with a diffusion layer in a silicon substrate, have been explained in the above, the fabrication method according to the present invention can be applied in a similar manner to formation of a so-called via-contact for connecting a lower wiring layer and an upper wiring layer with each other.

For the electrically conductive film resistant to the fluorine containing gas, apart from the titanium nitride film described in the embodiments, a tungsten nitride film may be used and further a lamination film consisting of a titanium nitride and a tungsten nitride film may be used.

In addition, for the underlayer disposed below the electrically conductive film resistant to the fluorine containing gas, apart from the titanium film described in the embodiments, a titanium alloy film such as titanium-tungsten alloy film, etc. may be used.

According to the present invention, when a hole in a contact structure such as a contact hole, a via-contact, etc. is filled with tungsten by the CVD method using a fluorine containing gas, such as $WF_6$ gas, since no titanium or titanium alloy film exists outside of the hole and there exists only an electrically conductive film such as the titanium nitride film or the tungsten nitride film resistant to the fluorine containing gas, no peeling-off of the electrically conductive film such as the titanium nitride film, the tungsten nitride, etc. due to corrosion of the titanium or titanium alloy film takes place. Therefore, there is no dust source and it is possible to increase fabrication yield.

What is claimed is:

1. A semiconductor device comprising:
    a semiconductor substrate;
    an insulating film, formed on said semiconductor substrate, having a contact hole in which one of a semiconductor layer and a conductive layer is exposed;
    a first conductive film including at least one of a titanium film and a titanium alloy film formed within said contact hole, said first conductive film being in contact with said one of said semiconductor layer and said conductive layer;
    a second conductive film, formed at least on said insulating film and said first conductive film, said second conductive film being resistant to a fluorine including gas; and
    a tungsten film formed so as to fill at least said contact hole.

2. A semiconductor device according to claim 1, wherein said titanium alloy film is a titanium-tungsten alloy film.

3. A semiconductor device according to claim 1, wherein said second conductive film is one selected from a group consisting of a titanium nitride film, a tungsten nitride film, and a laminated film including a titanium nitride film and a tungsten nitride film.

4. A semiconductor device according to claim 1, wherein:
    said tungsten film is also formed on said second conductive film; and
    said semiconductor device further comprises a wiring layer formed on said tungsten film.

5. A semiconductor device according to claim 1, further comprising a wiring layer formed on said second conductive film and said tungsten film.

6. A semiconductor device according to claim 4, wherein said wiring layer includes one of aluminium and copper.

7. A semiconductor device according to claim 5, wherein said wiring layer includes one of aluminium and copper.

8. A semiconductor device according to claim 1, wherein said contact hole is so formed that said insulating film has an inner surface which is substantially perpendicular to a top surface of said semiconductor substrate.

9. A semiconductor device comprising:
    a semiconductor substrate;
    a diffusion layer formed in said semiconductor substrate;
    an insulating film, formed on said semiconductor substrate, having a contact hole reaching said diffusion layer;
    a first conductive film formed within said contact hole;
    a second conductive film, formed at least on said insulating film and said first conductive film, said second conductive film being resistant to a fluorine including gas; and
    a tungsten film formed so as to fill at least said contact hole.

10. A semiconductor device according to claim 9, wherein said first conductive film includes at least one of a titanium film and a titanium alloy film.

11. A semiconductor device according to claim 10, wherein said titanium alloy film is a titanium-tungsten alloy film.

12. A semiconductor device according to claim 9, wherein said second conductive film is one selected from a group consisting of a titanium nitride film, a tungsten nitride film, and a laminated film including a titanium nitride film and a tungsten nitride film.

13. A semiconductor device according to claim 9, wherein:
    said tungsten film is also formed on said second conductive film; and
    said semiconductor device further comprises a wiring layer formed on said tungsten film.

14. A semiconductor device according to claim 9, further comprising a wiring layer formed on said second conductive film and said tungsten film.

15. A semiconductor device according to claim 13, wherein said wiring layer includes one of aluminium and copper.

16. A semiconductor device according to claim 14, wherein said wiring layer includes one of aluminium and copper.

17. A semiconductor device according to claim 9, wherein said contact hole is so formed that said insulating film has an inner surface which is substantially perpendicular to a top surface of said semiconductor substrate.

18. A semiconductor device comprising:
    a semiconductor substrate;
    an insulating film, formed on said semiconductor substrate, having a contact hole reaching said semiconductor substrate;
    a first conductive film formed within said contact hole;
    a second conductive film, formed at least on said insulating film and said first conductive film, said second conductive film being resistant to a fluorine including gas; and
    a tungsten film formed so as to fill at least said contact hole.

19. A semiconductor device according to claim 18, wherein:
    said first conductive film includes at least one of a titanium film and a titanium alloy film, and
    said second conductive film is one selected from a group consisting of a titanium nitride film, a tungsten nitride film, and a laminated film including a titanium nitride film and a tungsten nitride film.

20. A semiconductor device according to claim 18, wherein said contact hole is so formed that said insulating film has an inner surface which is substantially perpendicular to a top surface of said semiconductor substrate.

21. A semiconductor device comprising:
    a semiconductor substrate;
    a conductive layer formed over said semiconductor substrate;
    an insulating film, formed on said conductive layer, having a contact hole reaching said conductive layer;
    a first conductive film formed within said contact hole;
    a second conductive film, formed at least on said insulating film and said first conductive film, said second conductive film being resistant to a fluorine including gas; and
    a tungsten film formed so as to fill at least said contact hole.

22. A semiconductor device according to claim 21, wherein said first conductive film includes at least one of a titanium film and a titanium alloy film.

23. A semiconductor device according to claim 22, wherein said titanium alloy film is a titanium-tungsten alloy film.

24. A semiconductor device according to claim 21, wherein said second conductive film is one selected from a group consisting of a titanium nitride film, a tungsten nitride film, and a laminated film including a titanium nitride film and a tungsten nitride film.

25. A semiconductor device according to claim 21, wherein:

said tungsten film is also formed on said second conductive film; and said semiconductor device further comprises a wiring layer formed on said tungsten film.

26. A semiconductor device according to claim 21, further comprising a wiring layer formed on said second conductive film and said tungsten film.

27. A semiconductor device according to claim 25, wherein said wiring layer includes one of aluminium and copper.

28. A semiconductor device according to claim 26, wherein said wiring layer includes one of aluminium and copper.

29. A semiconductor device according to claim 21, wherein said contact hole is so formed that said insulating film has an inner surface which is substantially perpendicular to a top surface of said semiconductor substrate.

30. A semiconductor device comprising:

a semiconductor substrate;

an insulating film, formed on said semiconductor substrate, having a contact hole in which one of a semiconductor layer and a conductive layer is exposed;

a first conductive film including at least one of a titanium film and a titanium alloy film formed within said contact hole, said first conductive film being in contact with said one of said semiconductor layer and said conductive layer;

a second conductive film, formed at least on said insulating film and said first conductive film, said second conductive film being resistant to a fluorine including gas;

a third conductive film, formed at least on said second conductive film, also resistant to the fluorine including gas; and a tungsten film formed so as to fill at least said contact hole.

31. A semiconductor device according to claim 30, wherein said contact hole is so formed that said insulating film has an inner surface which is substantially perpendicular to a top surface of said semiconductor substrate.

* * * * *